United States Patent [19]

Okumura et al.

[11] Patent Number: 5,985,495

[45] Date of Patent: *Nov. 16, 1999

[54] METHODS FOR MEASURING IMAGE-FORMATION CHARACTERISTICS OF A PROJECTION-OPTICAL SYSTEM

[75] Inventors: Masahiko Okumura; Shinji Wakamoto, both of Tokyo, Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/824,219

[22] Filed: Mar. 25, 1997

[30] Foreign Application Priority Data

Mar. 25, 1996 [JP] Japan .................................. 8-067883
Mar. 28, 1996 [JP] Japan .................................. 8-073018

[51] Int. Cl.$^6$ ........................................................ G03F 9/00
[52] U.S. Cl. .............................................. 430/22; 430/30
[58] Field of Search ........................................ 430/22, 30

[56] References Cited

U.S. PATENT DOCUMENTS

| | | | |
|---|---|---|---|
| 4,908,656 | 3/1990 | Suwa et al. | 355/53 |
| 5,118,957 | 6/1992 | Kawashima et al. | 250/561 |
| 5,502,311 | 3/1996 | Imai et al. | 250/548 |
| 5,693,439 | 12/1997 | Tanaka et al. | 430/30 |
| 5,747,202 | 5/1998 | Tanaka | 430/30 |

*Primary Examiner*—Christopher G. Young
*Attorney, Agent, or Firm*—Klarquist Sparkman Campbell Leigh & Whinston, LLP

[57] ABSTRACT

Methods and apparatus are disclosed for exposing a reticle pattern onto a sensitive substrate (such as a sensitized semiconductor wafer) by projection-exposure at high focusing precision. According to the method, multiple evaluation marks are projected onto an area of the surface to form images of the evaluation marks. An image of a measurement mark is projected on or near at least some of the evaluation marks. Respective Z-direction displacements of each evaluation mark relative to a reference plane are detected by detecting a characteristic of the respective measurement mark that varies with a change in position of the measurement mark relative to the respective evaluation mark. Based on such measurements, an axial relationship of the projection-optical system relative to the substrate can be changed to place the substrate at a best-focus position before exposing the substrate with a reticle pattern. Associated apparatus are also disclosed.

10 Claims, 10 Drawing Sheets

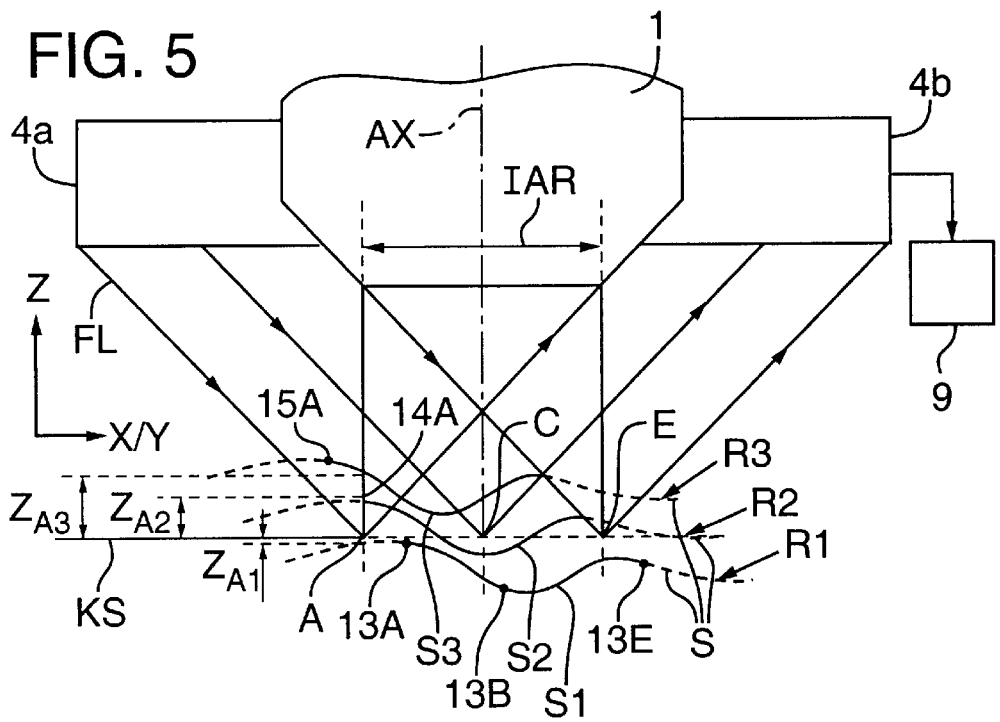
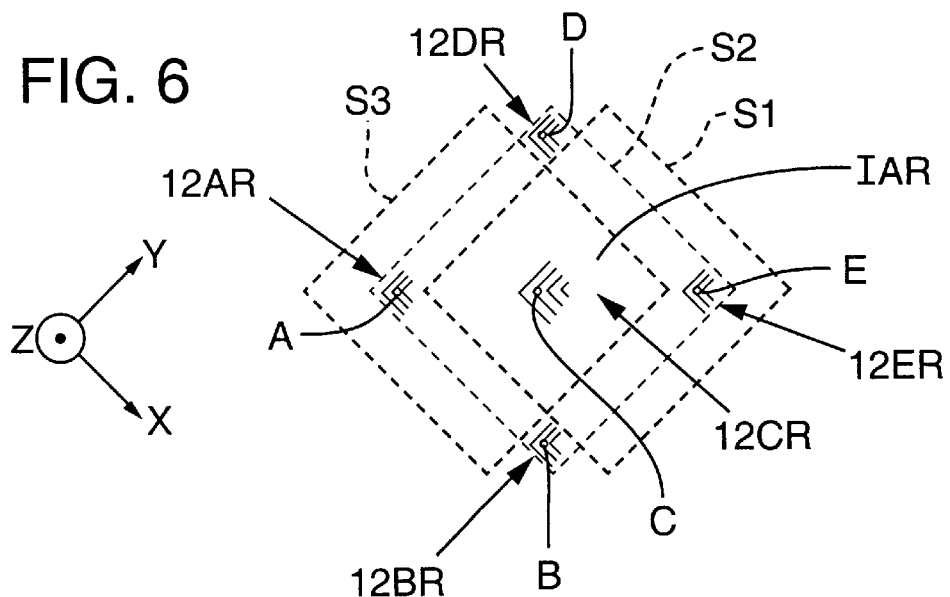

METHODS FOR MEASURING IMAGE-FORMATION CHARACTERISTICS OF A PROJECTION-OPTICAL SYSTEM

FIELD OF THE INVENTION

The present invention pertains to methods and apparatus for transferring, by projection exposure, a pattern defined by a mask or reticle onto a surface of a sensitive substrate, such as a semiconductor wafer, glass plate, or the like, as used to manufacture semiconductor devices, liquid-crystal display devices, imaging devices (such as charge-coupled devices), and thin-film magnetic heads, for example. More specifically, the invention pertains to methods and apparatus, as included with such projection-exposure apparatus, for measuring and correcting certain image-formation characteristics of a projection-optical system used with such projection-exposure apparatus.

BACKGROUND OF THE INVENTION

In photolithography as used for manufacturing semiconductor devices, liquid-crystal display devices, thin-film magnetic heads, and the like, a projection-exposure apparatus (e.g., a "stepper") is generally used to project a pattern, defined by a photomask ("mask") or reticle (either referred to generally below as a "reticle"), onto a sensitive surface of a semiconductor wafer, glass plate or other suitable substrate (referred to below as a "wafer"). The surface of the wafer is "sensitive" because it is coated with a photoresist or other suitable light-sensitive composition in a manner analogous to a photographic emulsion. Such projection-exposure apparatus typically include a projection-optical system (comprising a projection lens and illumination-light optics) that must exhibit excellent image-formation characteristics in order to transfer an image of the pattern image of the reticle onto the wafer with high resolution.

To such end, image-formation characteristics such as image-surface inclination and curvature of field of the projection-optical system are periodically measured. Correction of certain image-formation characteristics is usually performed based on the measurement results.

The projection-exposure apparatus generally include wafer stages comprising a Z-tilt stage that can adjust the wafer's axial position (height) and inclination in the Z direction and an XY stage that positions the wafer at a desired position on the XY plane.

Based on the premise that the wafer stage, especially the running guideways of the wafer stage, is nearly perfectly flat, measurement of the image-formation characteristics of the projection-optical system is conventionally performed as shown in FIGS. 16 and 17, wherein FIG. 17 shows a portion of the XY plane of FIG. 16. In both figures, measurements are taken of certain aspects of the image surface (on the wafer 3B) in the exposure field IAR (indicated by dashed line in FIG. 17) of the projection-optical system 1.

In FIG. 16, a focal-point-detection device 50 (comprising a light transmitter 50a and a light receiver 50b) is operable to detect the focal point of a wafer 3B situated downstream of the projection-optical system 1. In FIG. 16, the Z axis is parallel to the optical axis AX of the projection-optical system 1; the X and Y axes are on a plane perpendicular to the Z axis. A detection beam FL, produced by the light transmitter 50a, propagates at an angle to the optical axis AX toward a fixed detection point C located on or near the optical axis AX on the wafer 3B. The light transmitter 50a transmits a slit image onto the detection point C. The detection beam FL is reflected by the wafer 3B and enters the light receiver 50b. The light receiver 50b produces an output signal corresponding to the height position of a measurement point P1 on the wafer 3B corresponding to the detection point C. As shown in FIG. 16, there is a swell in the surface S of the wafer 3B. To prevent the swell from affecting the image-surface measurement, exposure is performed in the following sequence:

(1) The XY stage 5 is actuated to move the measurement point P1 on the surface S of the wafer 3B to the detection point C, and the Z-tilt stage 7 is actuated as required to place the measurement point P1 at the desired location (at the detection point C).

(2) With the Z-tilt stage 7 in a fixed position, the XY stage 5 is actuated to position the measurement point P1 at a measurement location A located at one end of the exposure field IAR. (In FIG. 16 the curved broken line shows the wafer position before actuation of the XY stage 5, and the curved solid line shows the wafer position afterward.) As shown in FIG. 17, wafer movement causes the area AR1, illustrated with broken lines on the wafer 3B that correspond to the exposure field IAR, to shift to the exposure field IAR. With the wafer 3B then remaining fixed, an illuminating light flux, generated by an illumination light source (not shown) located upstream of the projection-optical system 1, is irradiated onto a test pattern defined on the reticle (not shown, but located upstream of the projection-optical system and downstream of the illumination light source). The image IPA of the test pattern is exposed onto the measurement point P1 on the wafer 3B. In this scheme, the test-pattern image IPA is made up of multiple slit marks extending in the X direction and multiple slit marks extending in the Y direction (FIG. 17).

(3) The Z-tilt stage 7 is then actuated and the actions described in (1) and (2) above are repeated at multiple wafer elevations (Z-dimension positions) by changing the height of wafer 3B. The previously exposed test-pattern image IPA and the newly exposed test-pattern image IPA on the wafer do not overlap because the exposure position on the wafer 3B is slightly displaced in the XY plane each time as a result of moving the wafer each time in the Z direction.

(4) The actions described above in (1)–(3) are repeated at multiple locations other than position A on the wafer in the exposure field IAR.

(5) The exposed wafer 3B is developed; the exposed pattern reveals the position in the Z direction yielding the best image resolution for each position inside the exposure field IAR.

By the actions in (1)–(5), it is possible to determine how much curvature and inclination exists with respect to the image-formation surface of each position within the exposure field IAR, with the running guideway of the XY stage 5 as the reference.

In the conventional technique described above, a measurement error with respect to image-formation characteristics can arise if the flatness of the XY stage 5 running guideway is not sufficiently precise. This is especially because the XY stage 5 moves until the action described in (2) performs an exposure only after the action described in (1) establishes (measures) the height of the measurement point P1. There is a practical limit to the flatness of the running guideways of the XY stage 5. Also, the flatness tolerance of the running guideways of the XY stage tends to increase over time after repeated use. Also, as the numerical aperture of projection-optical systems increases so as to allow for further refinement of semiconductor elements and the like made using projection exposure, the required depth of focus has been decreasing.

Therefore, since the requirements for image formation, such as the image-surface curvature and inclination of the projection-optical system, have become more stringent, it is now impossible to ignore errors with respect to image-formation characteristics that accompany insufficient flatness of the XY stage running guideways. This problem cannot be avoided when using conventional methods and apparatus.

Moreover, since it is necessary to repeat the actions described above in (1)–(3) for each of the multiple measurement positions inside the exposure field IAR, the amount of time it takes to do the measurement increases in proportion to the number of measurement positions. This disadvantageously results in reduced throughput (productivity).

Furthermore, projection-exposing the reticle pattern onto the wafer involves an operation in which the patterned surface of the reticle is aligned with the wafer surface; that is, the focal points are aligned. As described above, depth of focus has recently been decreasing in projection-optical systems. Even when an i-line wavelength (365 nm) is used for exposure illumination, the depth of focus is only about 0.7 $\mu$m. In addition, the trend is toward greater increases in the size of the projection field of the projection-optical system.

Reference is made to U.S. Pat. No. 5,118,957 in which, in order to achieve satisfactory focal-point alignment across a wide exposure field, a slit image is projected obliquely relative to the optical axis AX (i.e., not projected through the projection-optical system) onto each of multiple measurement points inside the shot region (exposure field) of a wafer. A focal-point detector system (multiple-point AF system based on the oblique-incidence method) is used to receive and analyze light from each reflected image by a two-dimensional array sensor.

Reference is also made to U.S. Pat. No. 5,502,311 (corresponding to Japanese Laid-Open patent document no. Hei 5-190423) disclosing a separate optical system used for detecting focal points of the reticle pattern versus the wafer. The '311 patent also describes a method for calibrating such a multiple-point AF system with respect to the best-focus image surface at the time of projection exposure.

The multiple-point AF system disclosed in the '311 patent does not include a separate optical system for each measurement point. Rather the '311 patent discloses embodiments in which a "pin-hole" image from a light source is projected through a common optical system onto the wafer surface. The image directed by the optical system onto each measurement point on the wafer surface is reflected from the wafer surface and directed by the optical system to a detector. Each reflected image is separately detected using a two-dimensional sensor array in the detector.

According to the prior art, calibration of a multiple-point auto-focus (AF) system involves a determination of any offset between respective sensors corresponding to each measurement point. Correction of the offset between sensors involves servo control of the Z stage in consideration of each offset.

The focus calibration method described in the '311 patent uses a TTL (through-the-lens; i.e., through the projection-optical system) focus detection system and an oblique-incidence type multiple-point AF system to individually determine the offsets at each measurement point. An approximate plane is identified by means of the least-squares method using the determined offsets. The offsets of each measurement point are corrected and calculated with an approximate plane as a new reference. Thereafter, good focusing is achieved across the entire shot region (exposure field) on the wafer by vertically moving and/or tilting the Z stage so that the output signals obtained at each measurement point are equal to the offsets previously corrected and calculated.

It has been discovered, however, that focus can be blurred when attempting to expose a reticle pattern in a shot region after aligning the Z position of the shot region on the wafer using an oblique-incidence-type multiple-point AF system as summarized above in which focus calibration is performed by finding individual offsets at each measurement point. Moreover, careful investigation has revealed unstable circumstances in which the degree of focus disparity characteristic of a wafer having a certain type of exposure layer differs from the degree of focus disparity characteristic of a wafer having a different type of exposure layer. Also, it has been found that the focusing precision obtained with the oblique-incidence type multiple-point AF system varies with the wafer type.

SUMMARY OF THE INVENTION

In view of the shortcomings of the prior art discussed above, an object of the present invention is to provide projection-exposure methods and apparatus for measuring with high precision the image-formation characteristics of a projection-optical system.

Another object of the present invention is to provide such projection-exposure methods and apparatus that are unaffected by the flatness of the running guideway of the wafer stage.

Yet another object of the present invention is to provide such projection-exposure methods and apparatus that provide a satisfactory exposure of a reticle-pattern image onto a wafer surface.

Yet another object of the present invention is to provide such projection-exposure methods and apparatus that provide an exposure of a reticle-pattern image with good focus onto a substrate comprising any of various types of sensitive layer.

Yet another object of the present invention is to provide such projection exposure methods and apparatus that can expose a reticle-pattern image onto a substrate surface with good focus even when using an oblique-incidence type of multi-point AF system.

The foregoing objects are attained by the present invention that provides, inter alia, a projection-exposure method that comprises the following steps. First, the position of each of a plurality of points on a substrate is detected in an axial direction of a projection-optical system. Each of the points on the substrate is exposed with an image of a predetermined pattern through the projection-optical system. An image-formation characteristic of the projection-optical system is then obtained based on information pertaining to the images formed at the points on the substrate and on the detected positions corresponding to the points on the substrate. Finally, a substrate is exposed with an image of a pattern formed on a mask based on the obtained image-formation characteristic.

According to another aspect of the invention, a method is provided for measuring an image-formation characteristic of a projection-optical system. In a first step, a substrate is arranged on an image-plane side of the projection-optical system. Next, the position of each of a plurality of measurement points on the substrate is detected in an axial direction of the projection-optical system. Each of the measurement points on the substrate is exposed with an image of a predetermined pattern through the projection-optical system. Finally, an image-formation characteristic of the projection-optical system is obtained, based on information concerning the images formed at the measurement points on the substrate and on the detected positions corresponding to the measurement points on the substrate.

According to another aspect of the invention, a projection-exposure method is provided. A first step involves adjusting a detection system that detects a position of a substrate in an axial direction of a projection-optical system, based on a condition of a photoresist on the substrate. The substrate is then positioned according to the adjusted detection system. Finally, the positioned substrate is exposed with an image of a pattern formed on a mask.

According to yet another aspect of the invention, a projection-exposure apparatus is provided. The apparatus comprises a projection-optical system operable to project an image of a pattern formed on a mask. The apparatus also comprises a detecting system comprising a plurality of measurement points within a projection-field of the projection-optical system. The detecting system is operable to detect, at each of the measurement points, a position of a substrate in an axial direction relative to the projection-optical system. The apparatus also comprises a controller connected to the detecting system. The controller is operable to adjust an offset for each measurement point of the detecting system before exposing the substrate with the image of the mask pattern, based on a condition of the surface of the substrate.

According to yet another aspect of the invention, an improvement is provided in a projection-exposure method for exposing a reticle pattern onto a sensitive surface by illuminating the reticle pattern with an illumination light and projecting illumination light passing through the reticle pattern onto the sensitive surface using a projection-optical system having an optical axis extending in a Z direction. The improvement is preferably directed to placement of the sensitive surface at a best-focus position of the projection-optical system. As a first step, multiple evaluation marks are projected onto an area of the surface to form images of the evaluation marks within the area. An image of a measurement mark is projected on or near at least some of the evaluation-mark images on the surface. Respective Z-direction displacements of each evaluation mark relative to a reference plane are detected by detecting a characteristic of the respective measurement mark that varies with a change in position of the measurement mark relative to the corresponding evaluation mark. Based on the respective Z-direction displacements, an axial relationship of the projection-optical system with the sensitive surface is adjusted, preferably to place the sensitive surface at a best-focus position of the projection-optical system.

Preferably, evaluation marks are defined on a reticle and the evaluation marks are projected from the reticle to the surface using the projection-optical system. Further preferably, each evaluation mark comprises a slit pattern. Further preferably, the measurement marks are projected onto the surface at an oblique projection angle relative to the optical axis, and the measurement marks are preferably projected on or near the respective evaluation marks.

According to another aspect of the invention, a method is provided in which a substrate is placed on the image-formation side of the projection-optical system. Multiple evaluation marks of a specific pattern are projected onto multiple respective measurement points on the substrate. An image-formation characteristic of the projection-optical system is determined by obtaining information concerning the pattern of the evaluation marks formed on the substrate as the position of the substrate is changed relative to the projection-optical system. Preferably, a mask pattern is exposed onto the substrate after the image-formation characteristic has been determined for the projection-optical system. Measurement of the position, in the optical-axis direction, of the multiple measurement points can be performed simultaneously with exposure of the pattern image on the multiple measurement points. In such event, it is not necessary to move the substrate between measuring the position, in the optical-axis direction, of the measurement points and exposing them onto the substrate. As a result, there is no adverse effect of any deviations from absolute flatness of stage running guideways and the like, and measurement of the image-formation characteristic of the projection-optical system can be made with high precision. Since the multiple measurement points on the substrate are measured preferably all at substantially the same time, measurement time is significantly shortened.

According to yet another aspect of the invention, a method is provided for measuring an image-formation characteristic of a projection-optical system used in projection exposure of a reticle pattern onto an exposure field of a sensitive surface. The method comprises, as a first step, moving a reference plate to the center of the exposure field of the projection-optical system. A pattern of measurement marks is then projected onto the reference plate. Using a focal-point detector, focal-point positions of the measurement points on the reference plate are then detected. The focal-point detector is calibrated based on the focal-point positions of the measurement marks in the Z direction. A specified area of a sensitive substrate is then moved into the exposure field of the projection-optical system and a pattern of evaluation marks and a pattern of the measurement marks are projected onto the exposure field. While shifting the substrate in the X and Y directions, the substrate is set to multiple positions in the Z direction while changes are measured in a characteristic of the measurement points relative to the evaluation marks during such shifting in the X and Y directions and settings in the Z direction. The sensitive substrate is then developed to preserve the changes in the characteristic, and changes in the characteristic are then measured. Finally, the image-formation characteristic is calculated based on the measurements of the changes in the characteristic.

According to another aspect of the invention, a projection-exposure apparatus is provided. The apparatus comprises an illumination-light system for directing illumination light through a reticle pattern. The apparatus also comprises a projection-optical system for directing illumination light along a Z axis from the reticle pattern to form an image of the reticle pattern within a specific image-formation area on a sensitive surface of a substrate, the Z axis being an optical axis of the projection-optical system. Also included is an XY stage operable to hold the substrate for exposure of the sensitive surface and to move the substrate in X and Y directions, and a Z stage operable to move the substrate in the Z direction. The apparatus includes a focal-point detection system operable to project multiple measurement marks onto respective measurement points on the surface of the substrate, and to measure a focal-point characteristic of one or more of the measurement marks at multiple predetermined positions in the X, Y, and Z directions within the image-formation area of the projection-optical system, the focal-point characteristic exhibiting variability depending on the displacement of the respective measurement mark, relative to a focal-point reference, in the XY and Z directions. Finally, a control system is included to calculate, from measurements provided by the focal-point detection system, an offset for each measurement point sufficient to allow placement of the sensitive surface at an optical focus position of the projection-optical system.

The focal-point detection system preferably comprises a light transmitter and a light receiver, the light transmitter being operable to project a pattern of measurement marks on the exposure region of the substrate, and the light receiver being operable to receive light, from the light transmitter, reflected from the surface of the substrate. The light transmitter and the light receiver are preferably placed relative to the projection-optical system so as to project and receive, respectively, light from directions that are oblique to the optical axis of the projection-optical system.

Further with respect to the apparatus, the focal-point detection system preferably projects multiple measurement marks. One of the measurement marks is preferably a reference mark, and the control system is operable to measure the offset of other measurement points relative to the reference mark.

The present invention makes it possible to expose a mask pattern with the best possible focus regardless of the condition of the substrate surface. Moreover, it is now possible to improve the measurement precision and stability of the oblique-incidence type multi-point AF system.

The foregoing and additional features and advantages of the present invention will be more readily apparent from the following detailed description, which proceeds with reference to the accompanying drawings.

BRIEF DESCRIPTION OF THE DRAWINGS

FIG. 5 is an elevational drawing providing explanatory information concerning how the focal-point positions are preferably measured at multiple measurement points by changing the height of the wafer relative to the projection-optical system 1.

FIG. 6 is a top plan view showing the arrangement of measurement points within the exposure field IAR shown in FIG. 5.

DETAILED DESCRIPTION

A preferred embodiment of the present invention will be explained with reference to FIGS. 1–10, directed to a stepper-type projection-exposure apparatus for exposing an entire reticle pattern onto each shot region on a wafer using a projection-optical system.

Figure 2:
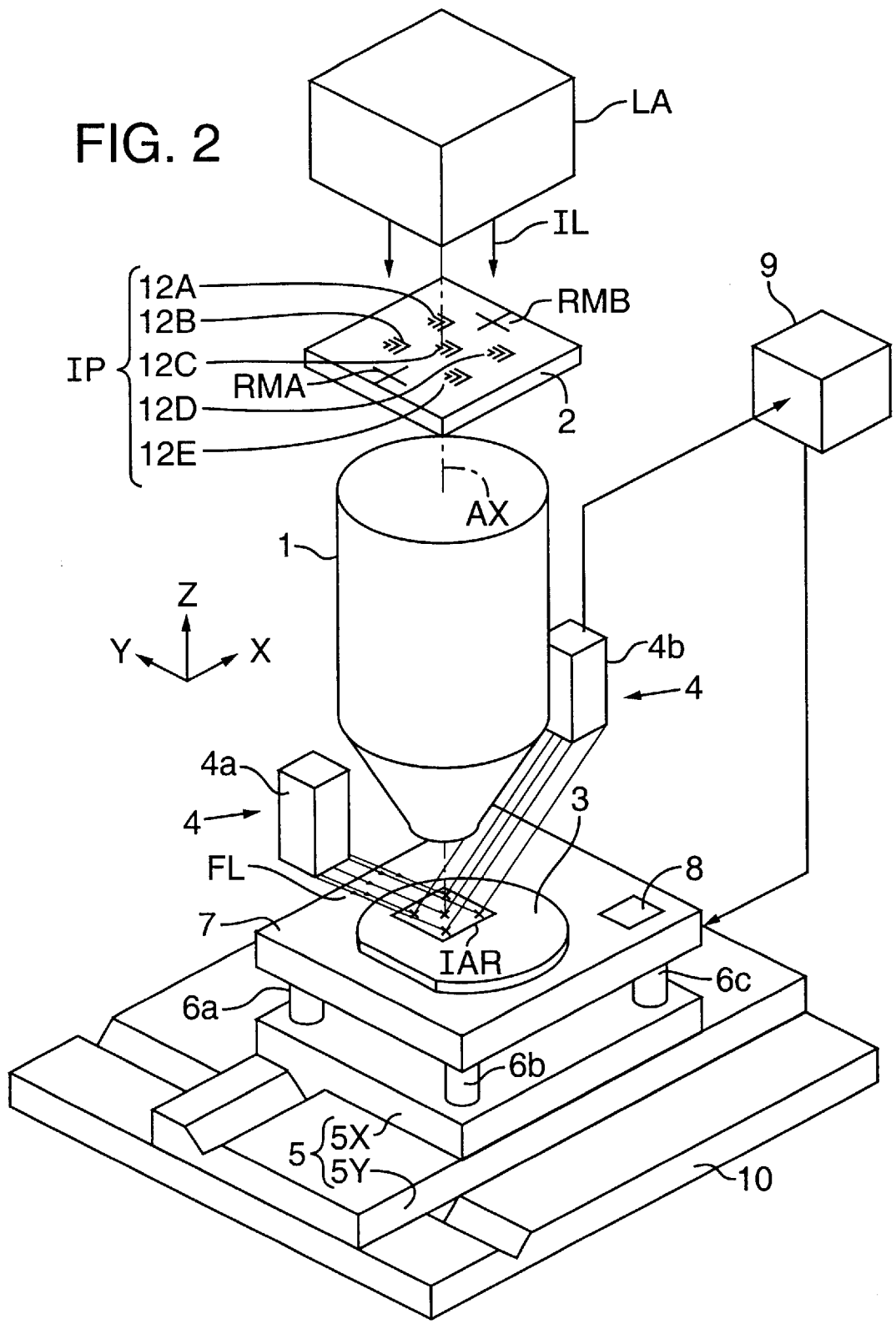
FIG. 2 is an oblique elevational drawing showing general structural features of a preferred embodiment of an apparatus according to the present invention.

An oblique elevational view is provided in FIG. 2 of the overall general structure of a projection-exposure apparatus according to this embodiment. In FIG. 2, the Z axis is parallel to the optical axis AX of is a projection-optical system 1. The X axis and the Y axis are orthogonal to the Z axis. A "lighting arrangement" LA is situated upstream of the projection-optical system 1. The lighting arrangement LA preferably includes the following components (not shown): a light source operable to produce an illumination light 12, a fly-eye lens that equalizes the distribution (in the X and Y directions) of illuminating light on the reticle 2, an adjustable field stop that controls the width (in the X and Y directions) of the illuminating light on the reticle 2, and a condenser lens. The illuminating light IL can be an i-line or g-line light from an ultra-high pressure mercury lamp, a KrF excimer laser beam, an ArF excimer laser light beam, a copper-vapor laser beam, or a YAG laser harmonic, or other suitable light. The illuminating light IL passes through the reticle 2 and then through the projection-optical system 1. The illuminating light IL that passes through the reticle 2 transfers and thus exposes the circuit-pattern image defined on the reticle 2 onto each shot region on the wafer 3 that has been coated with a suitable photoresist.

Referring further to FIG. 2, the reticle 2 is mounted on a reticle stage (not shown). The reticle stage is operable to move the reticle in the X and Y directions. The pattern defined on the reticle 2 is flanked with individually intersecting reticle alignment marks RMA and RMB, used for positioning the reticle 2. The reticle 2 also includes multiple (e.g., five) evaluation marks, 12A–12E for measuring characteristics, relative to the optical axis AX, of an image formed by the projection-optical system 1 inside the four corners of the pattern on the reticle 2.

Figure 8:
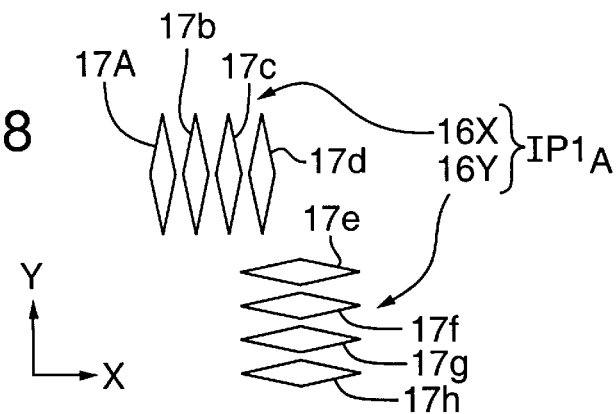
FIG. 8 is an enlarged top plan view of a preferred pattern image for the measurement marks at one of the measurement points shown in FIG. 7.

In the following, the evaluation marks 12A–12E are referred to collectively as the "measurement pattern" IP. Each evaluation mark 12A–12E is shown in FIG. 2 as a series of slits extending in the X and Y directions; actually, each evaluation mark comprises multiple diamond-shaped marks, as illustrated in FIG. 8. Details are provided later.

For evaluation purposes, a test wafer 3 is vacuum chucked to a wafer holder (not shown) on a Z-tilt stage 7. Individual deformable focus-levelers 6a–6c are secured to the underside of three corners of the Z-tilt stage 7. The Z-tilt stage 7 is mounted on an X stage 5X which moves a Y stage 5Y in the X direction. The Y stage 5Y moves in the Y direction relative to a base 10.

The focus levelers 6a–6c are individually and controllably actuated by a main controller 9 that also controls the entire projection-exposure apparatus. During normal exposure, the height and inclination angle of the Z-tilt stage 7 can be adjusted, via the focus levelers 6a–6c, by commands from the main controller 9 so that the image surface of the reticle pattern will be uniform on the surface of the test wafer 3. The XY stage 5 comprises this Y stage 5Y and the entire X stage 5X, and the wafer stage comprises the XY stage 5 and the Z-tilt stage 7. The XY stage 5 is controllably actuated by the main controller 9. The main controller 9 actuates the XY stage 5 based on information about the position of the XY stage 5 as obtained from a respective interferometer (not shown) and thus positions the test wafer 3 two-dimensionally (X and Y directions) so as to permit exposure of the wafer by a so-called "step-and-repeat" method. During evaluation of the image-formation characteristics of the projection-optical system 1 before exposing the test wafer 3 with the pattern on the reticle, the image of the measurement pattern IP is exposed onto the test wafer.

Flanking the projection-optical system 1 is an oblique-incidence-type multiple focal-point position-detection system (referred to below as the "focal-point detector" 4) comprising a light transmitter 4a and a light receiver 4b. The light transmitter 4a comprises optics that project, via a detection beam FL, an image of a slit pattern onto multiple locations (measurement points) inside the exposure field IAR on the test wafer 3. The detection beam FL has a wavelength that does not sensitize the photoresist on the wafer 3. Light from the slit-pattern images is reflected to the light receiver 4b which re-forms the images of the slit pattern. The light transmitter 4a is positioned laterally above the top of the wafer stage, and is rotated 45 degrees counterclockwise to the Y axis of projection-optical system 1. The light receiver 4b is positioned bilaterally symmetrically to the light transmitter 4a on the opposing side of the optical axis AX. The focal-point detector 4 precisely measures the Z-direction positions (focal-point positions) of each of the multiple measurement points on the surface of the wafer 3.

Any Z-direction displacement of the multiple measurement points on the surface of the wafer 3 with respect to a specified reference plane is detected as a position shift of the re-formed image of the slit pattern by the light receiver 4b.

Multiple focus signals corresponding to the amount of that position shift are produced by the light receiver and supplied to the main controller 9.

Based on the focus signals, the main controller 9 actuates the focus levelers 6a–6c so as to match the surface of the test wafer 3 to the image-formation surface of the projection-optical system 1.

Normally, the multiple focus signals are offset so that the image-formation surface of the projection-optical system 1 becomes a "zero-point" reference. Auto focus as well as auto leveling are performed until each focus signal from the light receiver 4b becomes 0.

A reference plate ("datum plate") 8 is situated at the +X and −Y corner of the Z-tilt stage 7 for calibrating the focal-point detector 4. The reference plate 8 has a high degree of flatness and a high reflectivity. The reference plate 8 is arranged so that its surface is substantially at the same height as the surface of the wafer 3. The center of the reference plate 8 corresponds to the center of the exposure field IAR. The flatness of the reference plate 8, being the specified standard set for the amount of deformation of the focus levelers 6a–6c, is measured by a specified measurement device, and that measurement is stored in a memory of the main controller 9.

Figure 3:
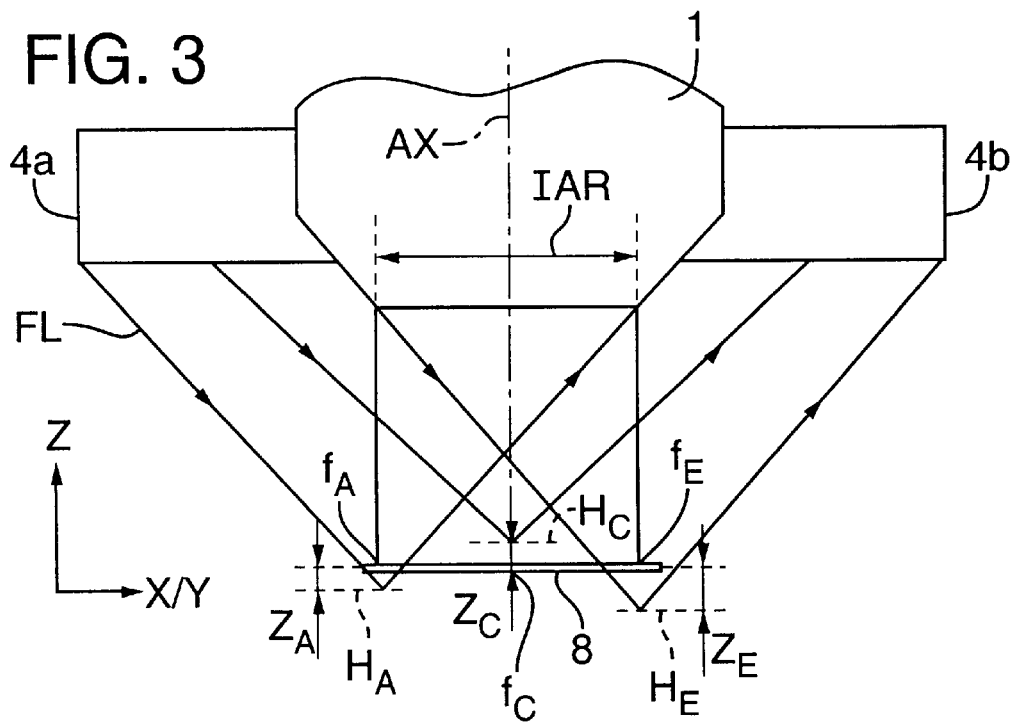
FIG. 3 is an elevational drawing providing explanatory information concerning calibrating the focal-point-position detection system shown in FIG. 2.

During calibration of the focal-point detector 4, the XY stage is actuated to move the reference plate 8 into the exposure field IAR of the projection-optical system 1 (see FIG. 3). In the following discussion, the flatness of the reference plate 8 is assumed to be essentially "perfect". The material from which the reference plate 8 is made should be able to resist surface deformation and heat under normal-use conditions. Also, the reference plate 8 should be made of a material having a good reflectivity (e.g., metal, glass, or the like.).

Figure 1:
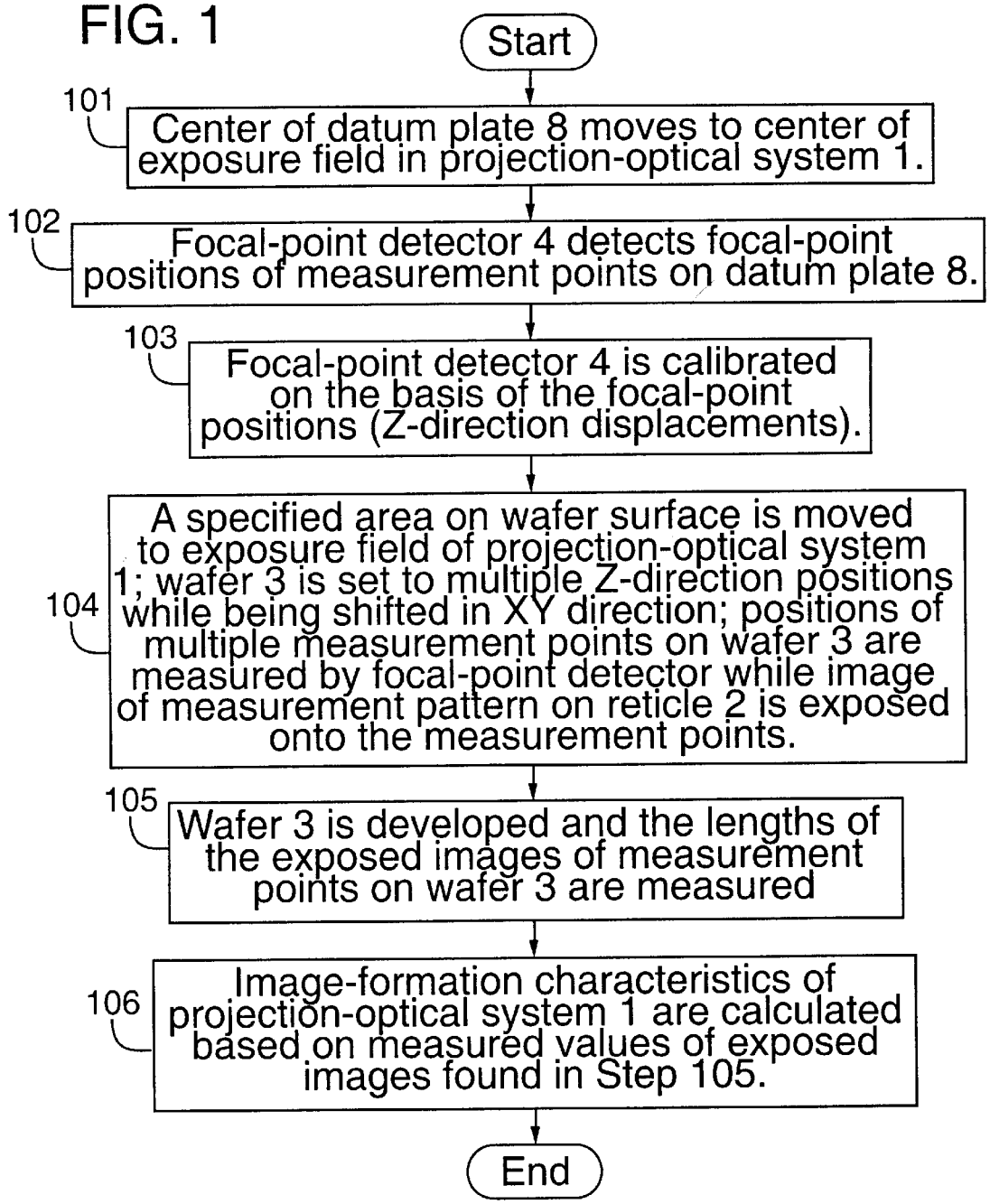
FIG. 1 is a flow chart of a preferred embodiment of a method according to the present invention.

The preferred method for evaluating the image-surface curvature and inclination (as representative image-formation characteristics) of the projection-optical system 1 is explained below with reference to FIG. 1, which is in the form of a flow chart. As a preliminary step, the focal-point detector 4 is calibrated. Then, the image-surface curvature and inclination of the projection-optical system 1 are measured using the calibrated focal-point detector 4.

In a first step 101, the XY stage 5 is actuated to bring the center of the reference plate 8 to the approximate center of the exposure field IAR of the projection-optical system 1 (i.e., to the optical axis AX). At such a position, the amount of deformation of each of the focus levelers 6a–6c is set to a specified standard to allow calibration of the focal-point detector 4.

FIG. 3 depicts the method by which the focal-point detector 4 is calibrated. In FIG. 3, the projection-optical system 1 of FIG. 1 is viewed from a location rotated 135 degrees clockwise from the X axis.

In the second step 102 (FIG. 1), a slit-pattern image is irradiated by the detection beam FL onto each of multiple evaluation points inside the exposure field IAR on the reference plate 8, as shown in FIG. 3. In FIG. 3, for example, the slit-pattern images are irradiated by the detection beam FL at or near the evaluation points $f_A$, $f_C$ and $f_E$ on the surface of the reference plate 8.

Since the focal-point detector 4 has not yet been calibrated, the locus of each slit-pattern image relative to its corresponding evaluation point may be different. For example, in FIG. 3, the locus of the slit-pattern image at the evaluation point $f_A$ is on the plane $H_A$ which is below the evaluation point $f_A$. Thus, the focus signal (produced by the light receiver 4b) for the evaluation point $f_A$ corresponds to "Z-direction" (height) displacement $Z_A$ relative to the plane $H_A$ and the surface of the reference plate 8. In the same way, for the evaluation points $f_C$ and $f_E$, the light receiver 4b outputs focus signals that respectively correspond to the Z-direction displacements $Z_C$ and $Z_E$ relative to the respective planes $H_C$, $H_E$ and the surface of the reference plate 8. The outputs corresponding to $Z_A$, $Z_C$, and $Z_E$ are routed by the light receiver 4b to the main controller 9. Likewise, focus signals corresponding to the Z-direction displacements of all other evaluation points are also supplied to the main controller 9.

In the third step 103, hardware and software adjustments are made in order to perform the calibration of each focus-signal output, corresponding to each evaluation point, from the focal-point detector 4; namely, by making adjustments to establish a relationship in which, for each evaluation point, $Z_A=Z_C=Z_E=0$, for example. Thus, the focal-point detector 4 is calibrated (i.e., an "origin calibration" is completed).

Figure 4:
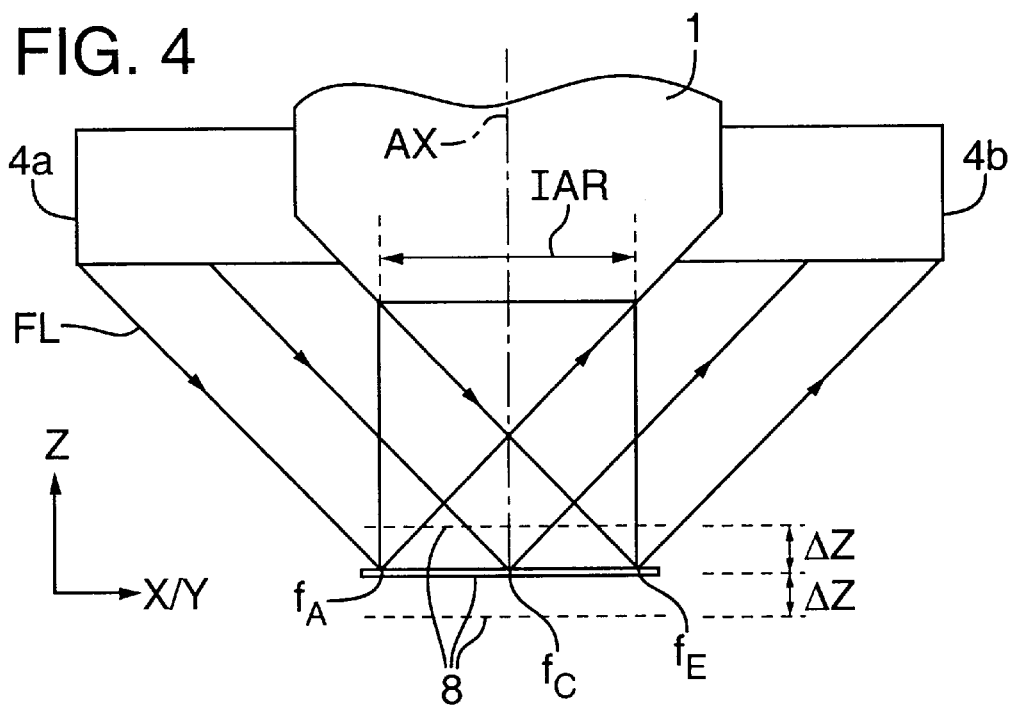
FIG. 4 shows the focal-point-position detection system of FIG. 3 after completion of calibration.

FIG. 4 shows the effect on the displacement values $Z_A$, $Z_C$, and $Z_E$ after completing calibration of the focal-point detector 4. In FIG. 4, the locus of each evaluation point $f_A$, $f_C$, $f_E$ (and of all other evaluation points) is now flush with the height of the surface of the reference plate 8. In such a circumstance, outputs from the light receiver 4b corresponding to the respective displacement values $Z_A$, $Z_C$, $Z_E$ are the same. Hence, it is now possible to measure and adjust the sensitivity, during Z-direction displacement, of the focus signal at each evaluation point from the change in the output of the focus signal from the light receiver 4b after vertically shifting the reference plate 8 by an amount ($\Delta Z$) in the Z direction as shown by the broken lines. This completes the calibration of the focal-point detector 4.

Next, the focal-point detector 4 is used to measure the position of the image-formation surface of the projection-optical system 1. FIG. 5 depicts a preferred apparatus and method for performing such a measurement. FIG. 6 is a top plan view of a portion of FIG. 5.

As FIG. 6 shows, preferably five measurement points A–E are established on the wafer 3 at respective corners and in the center of the exposure field IAR of the projection-optical system using the light transmitter 4a of the focal-point detector 4. Three of the five measurement points, A, C, and E, are shown in FIG. 5.

For measuring the Z-direction position of each measurement point A–E on the wafer 3 by the focal-point detector 4, the surface of the wafer 3 can be shifted in the Z direction using the focus levelers 6a–6c shown in FIG. 2 and in the X and Y directions using the XY stage. Changes in focus signals corresponding to the respective measurement points are produced by the light receiver 4b accompanying such shifts (usually very slight) of the wafer 3 in the Z direction. Meanwhile, the wafer 3 is moved in the XY direction to so shift the measurement points A–E horizontally in the XY plane. For each respective height and XY position of the wafer 3, the image of a measurement pattern IP defined on the reticle 2 is exposed near each measurement point inside the exposure field IAR, and any corresponding changes in the image of the measurement pattern IP are measured.

FIG. 5 illustrates a condition in which the wafer 3 is situated at three different Z-direction positions R1, R2, R3. The region inside the exposure field IAR on the surface S of the wafer 3 when at the R2 position is denoted (solid lines) as S2. The regions S1 and S3 represent the exposure field IAR that has been shifted slightly in a lateral direction (in the XY plane) when the wafer is in the R1 and R3 position, respectively. As shown in FIGS. 5 and 6, the region S2 falls completely within the exposure field IAR, but the regions S1 and S3 do not.

In the fourth step 104 (FIG. 3), the XY stage 5 is actuated so that the center of, e.g., the region S1 falls completely within the exposure field IAR.

As FIG. 5 illustrates, the surface S of the wafer 3 can be set at the RI position near the image-formation surface of the projection-optical system 1. The respective amounts of Z-direction displacement from the reference line KS (representing an image-formation surface where the focus signals are all zero) of the measurement points 13A–13E (see FIG. 7) on the wafer 3 that correspond to the measurement points A–E (see FIG. 6) of the focal-point detector 4 are measured.

For the measurement point 13A on the wafer, for example, FIG. 5 shows that the amount of Z-direction displacement from the reference line KS is $Z_{A1}$. In the same way for each of the other measurement points 13B–13E, the amounts of Z-direction displacement from the reference line KS are measured. The data for these displacement amounts are supplied to and stored in the memory of the main controller 9. Afterward, the illuminating light IL is irradiated onto the measurement pattern IP (see FIG. 2) on the reticle 2. Such exposure causes an image of the measurement pattern IP to be formed on the measurement points 13A–13E of the region S1 on the wafer 3. As discussed above, the measurement pattern IP comprises multiple evaluation marks 12A–12E, as described above, and an image of each evaluation mark is projected onto the corresponding measurement point AE in the exposure field IAR.

Next, while the wafer 3 is displaced slightly in the Z direction so that the Z-direction displacement is now R2, the XY stage 5 is actuated and the position of the wafer 3 moves in the X and Y directions just enough to align the center of the region S2 on the surface of the wafer 3 with the center of the exposure field IAR of the projection-optical system 1. As performed previously with the region S1 on the surface of the wafer 3, while measuring the Z-direction displacement of the wafer 3 at each measurement point A–E with the wafer at the R2 position, an image of the measurement pattern IP is formed on the region S2 on the surface of the wafer 3.

Next, while the wafer 3 is moved slightly again in the Z direction so that the Z-direction position of wafer 3 is now R3, the XY stage is actuated and the wafer 3 moves just enough in the X and Y directions so that the center of the region S3 on the surface of the wafer 3 is aligned with the center of the exposure field IAR of the projection-optical system 1. Then, in the same way as with regions S1 and S2 of the surface of the wafer 3, while measuring the amount of Z-direction displacement of the wafer 3 at each measurement point A–E, an image of the measurement pattern IP of the reticle 2 is exposed on the region S3 on the surface of the wafer 3. The amount by which the wafer 3 moves in the X and Y directions is sufficient such that the measurement patterns IP1–IP3 exposed on the regions S1, S2, and S3, respectively, of the wafer 3 do not overlap.

By the actions described above, as shown for example in FIG. 5, the amounts of Z-direction displacement $Z_{A2}$ and $Z_{A3}$ are measured at measurement points 14A and 15A on the wafer 3, the points 14A, 15A corresponding to the measurement point A at the Z-direction positions R2 and R3. In the same way, the amount of displacement in the Z direction is also measured for the other measurement points. Data concerning all of these measurements are routed to the memory of the main controller 9 for storage. In any event, an image of the measurement pattern IP on the reticle 2 is exposed onto the wafer 3 at each of the positions R1–R3.

FIG. 6 illustrates the images of the evaluation marks 12AR–12ER that are projected onto the four corners and center in the region S2 that is aligned with the exposure field IAR. The Z-direction position on the wafer 3 is actually set at four or more locations with the necessary measurement resolution, and an exposure is made at each location.

In the fifth step 105, the wafer 3 is developed after being exposed, and the images of the measurement patterns IP1–IP3 are measured.

Figure 7:
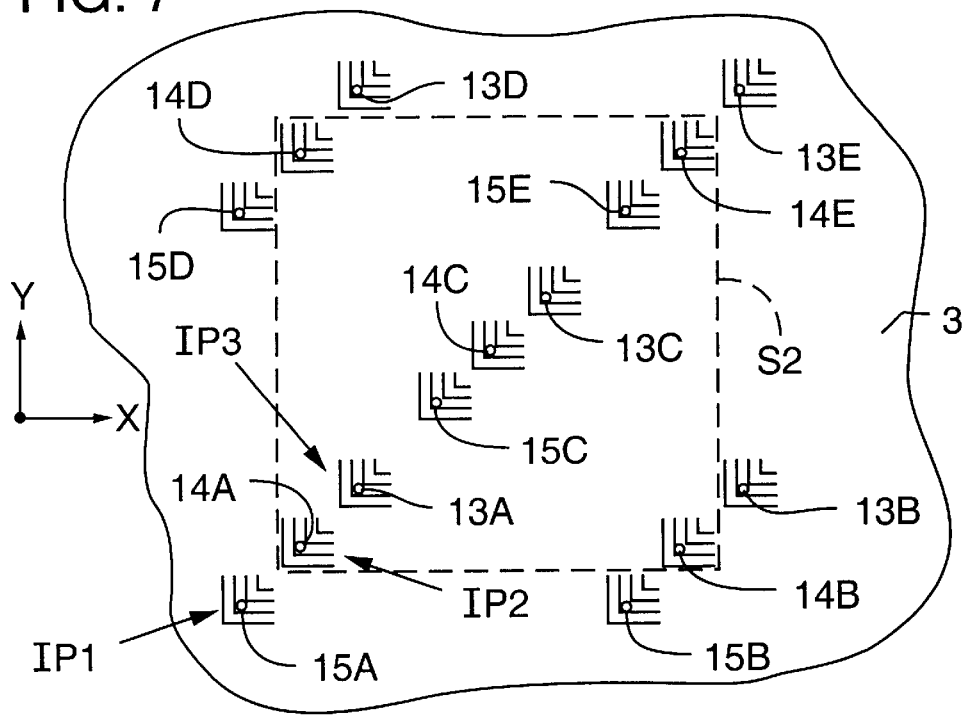
FIG. 7 is an enlarged top plan view showing the arrangement of the measurement-image pattern exposed on the wafer 3.

FIG. 7 shows a representative image of the measurement patterns IP1–IP3 exposed on the wafer 3. For the purpose of explanation, FIG. 7 indicates the region S2 on the wafer with a dashed line.

In FIG. 7, the image of each measurement pattern IP1 and IP3 is formed shifted to the side relative to the region S2 (containing all the measurement pattern IP2) on the wafer 3. For example, exposed images are formed of the measurement points 13A, 14A, 15A on the wafer, corresponding to one measurement point A inside the exposure field IAR and three Z-direction positions R1–R3. Exposed images of measurement points are also formed at points 13B–15B, 13C–15C, 13D–15D, and 13E–15E on the wafer 3, corresponding to the other measurement points B–E.

FIGS. 6 and 7 suggest that the image of each measurement "point" formed on the wafer 3 comprises a series of multiple longitudinal slit-shaped elements in the X or Y direction. Actually, each measurement-point image preferably comprises multiple diamond-shaped elements as shown in FIG. 8.

FIG. 8 also shows the actual arrangement of an exposed image of a measurement point $IP1_A$ formed on the wafer. In FIG. 8, the exposed measurement-point image $IP1_A$ comprises the evaluation pattern 16X on the X axis made up of four diamond-shaped basic marks 17a–17d extending in the Y direction and formed at a specific pitch in the X direction, and the evaluation pattern 16Y on the Y axis made up of four diamond-shaped basic marks 17e–17h extending in the X direction and formed at a specific pitch in the Y direction. Similar exposed images are made for the other measurement points $IP1_{B-E}$, $IP2_{A-E}$, $IP3_{A-E}$ formed on the wafer. The shape of the basic marks, and the number of basic marks-are not limited to being diamond-shaped and/or four in number, respectively; they may be any suitable shape and/or number as situations indicate.

Next, the image-surface curvature, inclination, and other image-formation characteristics of the projection-optical system 1 are determined from the condition of these diamond-shaped basic marks 17a–17h for each measurement pattern IP1–IP3.

A representative example of how to calculate the image-formation characteristics of the projection-optical system 1 from the condition of the basic marks 17a–17h is as follows.

The closer the Z-direction position of each of the measurement points on the wafer 3 to the actual image-formation surface (referred to below simply as the "image-surface position") of the projection-optical system 1, the higher the resolution that can be obtained. The closer the proximity of a measurement point, the greater the length of the major axis of each diamond-shaped basic mark 17a–17h.

Measurement of the condition of the diamond-shaped basic marks is done using a suitable measuring apparatus. For example, the measuring apparatus can comprise a projection-exposure device equipped with an alignment sensor that, for instance, scans the basic marks using a slit-shaped laser beam and detects diffracted light from the scanned basic marks.

Specifically, the average length (i.e., "mark length") in the Y direction of the four basic marks 17a–17d is measured. Similarly, the average length in the X direction of the four basic marks 17e–17h is measured. As such measurements are performed, the information is supplied to the main controller 9 via an input device (not shown, but such as a keyboard or other suitable device) manipulated by an operator.

In the next step 106, the main controller 9 calculates the image-formation characteristics of the projection-optical system 1, based on the supplied data. The calculations may alternatively be performed by a separate computer. In the following description, and by way of example, the lengths of the exposed basic marks 17a–17d measured at the measurement point 13A on the wafer 3 in FIG. 7 are denoted LXA1. Similarly, the lengths of the exposed basic marks 17e–17h measured at the measurement point 13A are denoted LYA1. The average length LA1 of the basic marks at the measurement point 13A is calculated as follows:

LA1=(LXA1+LYA1)/2

In a similar manner, the lengths of the four basic marks on each of the X axis and Y axis are found for the measurement points 14A and 15A in FIG. 7, and the average mark length is calculated. The X-axis mark lengths for the measurement points 14A and 15A are denoted LXA2 and LXA3, respectively, and the Y-axis mark lengths are denoted LYA2 and LYA3, respectively. The average mark lengths at the measurement points 14A and 15A are denoted LA2 and LA3, respectively. The average mark lengths LA1, LA2, and LA3 may be regarded as the mark lengths for the evaluation-mark images at the time the measurement point A inside the exposure field IAR was set to the Z-direction positions ZA1, ZA2, and ZA3 (amount of shift from the reference line KS). Under actual conditions, mark lengths are found at many more positions in the Z direction.

Figure 9:
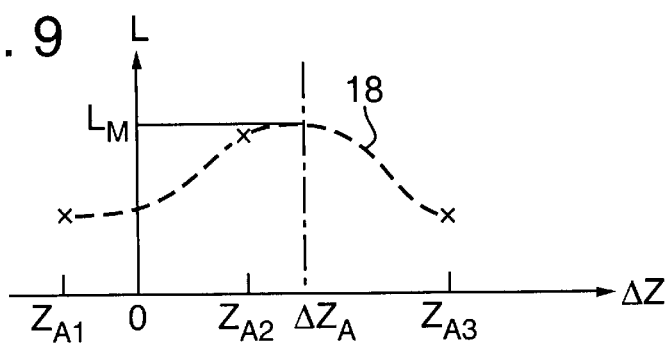
FIG. 9 is a plot of the relationship between the amount of Z-direction displacement at one measurement point A shown in FIG. 6, and the length of the average mark of a projected measurement pattern image.

FIG. 9 illustrates the relationship between the Z-direction positions on the wafer 3 at measurement point A and the average mark length at that position. In FIG. 9, the horizontal axis indicates the Z-direction displacement amount $\Delta Z$ from the reference line KS on the surface of the wafer 3 at the measurement point A; and the vertical axis indicates average basic-mark length L. In FIG. 9, the curved line 18 is a plot of the average mark length from the time when multiple positions were set for the Z-direction position on the wafer 3 at the measurement point A, including the Z, $Z_{A2}$, and $Z_{A3}$ displacement amounts, and also represents an interpolation by curvilinear approximation. The displacement $\Delta Z_A$ denoting the largest average mark length $L_M$ on this curved line 18 is found. Thus, the Z-direction position that was displaced $\Delta Z_A$ from the reference line KS is detected as an image-surface position (best-focus position) of the projection-optical system 1 with respect to the measurement point A.

In the same way, by measuring and plotting the average mark lengths of the measurement points 13B to 13E, 14B to 14E, and 15B to 15E inside the exposure field in FIG. 7, the image-surface positions are detected at the other measurement points B–E. The displacement amount $\Delta Z$ of the image-surface position at each measurement point B–E is denoted $\Delta Z_B$–$\Delta Z_E$, respectively.

Figure 10:
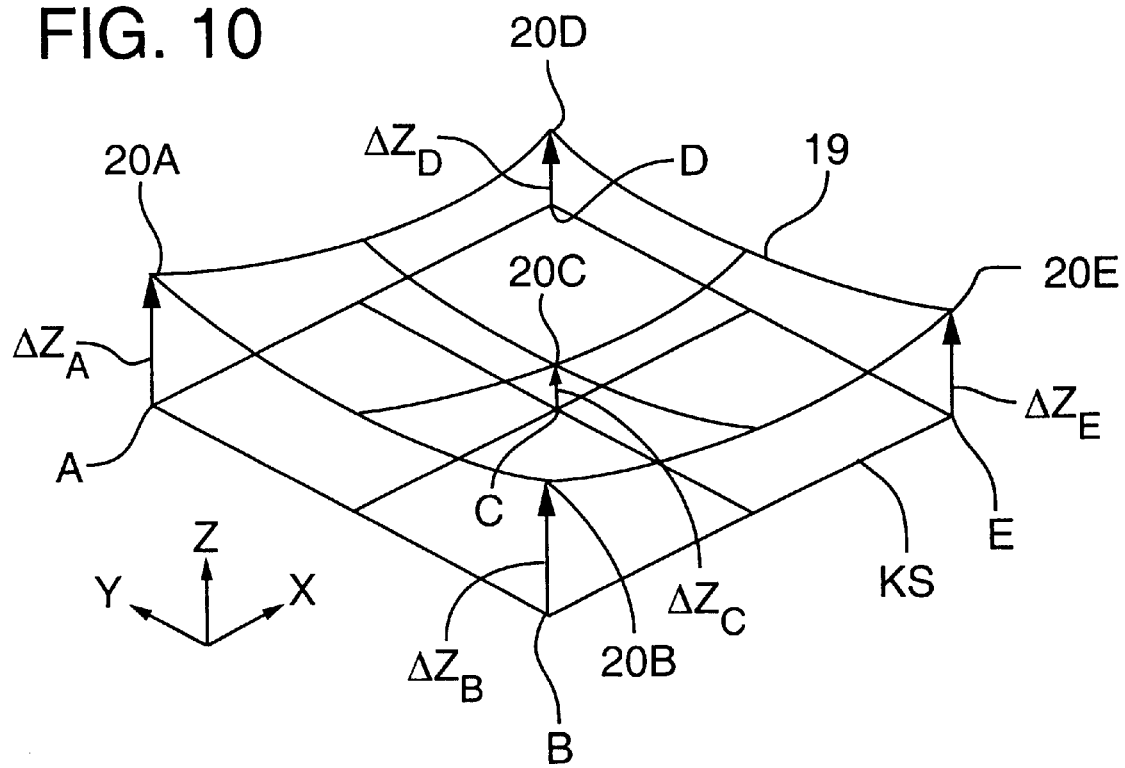
FIG. 10 is an oblique elevational drawing showing a representative condition of the image-formation surface of the projection-optical system.

FIG. 10 depicts a representative locus of displacement amounts, relative to the reference plane KS, of the image-surface positions at measurement points A–E inside the exposure field IAR found using a calculation as described above. In FIG. 10, the points 20A–20E corresponding to the displacement amounts $\Delta Z_A$–$\Delta Z_E$ of the image-surface positions at the measurement points A–E, respectively, are spherically approximated using an interpolation method to find the image-formation surface 19 of the projection-optical system 1.

The offset of each focus signal is readjusted based on the foregoing results so that the focus signals at the image-formation surface 19 of the projection-optical system 1 all become zero. Using the focal-point detector 4 after the readjustment, the wafer surface is aligned to the image-formation surface 19 by auto-focusing and auto-leveling.

It is also possible to make an adjustment using a method that controls the inclination angle of a specific lens of the projection-optical system 1, for example, so as to make the image-formation surface 19 as flat as possible.

In the foregoing description of the preferred embodiment, five measurement points A–E were established within the exposure field IAR of the projection-optical system 1. Also, exposures and measurements were performed at three Z-direction positions of the wafer 3. However, it will be understood that the arrangement of the measurement points is not so limited. It is acceptable to select a number of measurement points and their relative arrangement so as to correspond with a desired measurement precision of the image-surface position of the projection-optical system 1.

The embodiment described above represents an example in which the image-surface curvature and inclination are the image-formation characteristics of projection-optical system 1 that are measured. However, the following will show that it is also possible to find the astigmatism of the projection-optical system 1, for example, from the exposed image formed at the measurement points on the wafer 3 corresponding to the measurement points A–E.

In brief, and by way of example, the image-surface position of the projection-optical system 1 (i.e., the best-focus position) is calculated from, inter alia, the mark lengths LXA1–LXA3 of the X-axis evaluation pattern 16X at the measurement point A following the method explained above with respect to FIG. 9. The image-surface positions are likewise found for each of the X-axis evaluation patterns corresponding to the other measurement points B–E. The corresponding displacements of the image-surface positions from the reference plane KS on these measurement points A–E are denoted $\Delta LX_A$ to $\Delta LX_E$, respectively. The image-surface position of the projection-optical system 1 is also similarly calculated from the mark lengths LYA1–LYA3 of the Y-axis evaluation pattern 16Y at the measurement point A, and the image-surface positions of the Y-axis evaluation patterns for the other measurement points B–E are found. Referring to the amounts of displacement of these image-surface positions respectively as $\Delta LY_A$, to $LY_E$, the astigmatism of the projection-optical system 1 can be calculated from the difference between the displacement amounts $\Delta LX_A$ to $\Delta LX_E$ and $\Delta LY_A$ to $\Delta LY_E$.

In the foregoing embodiment, the reference plate 8 placed on the Z-tilt stage 7 is the preferred means for calibrating the focal-point detector 4 and for establishing a reference for each focus signal produced by the focal-point detector 4. Furthermore, using the focal-point detector 4 after calibration, the Z-direction positions of the wafer 3 at measurement points A–E can be measured at the same time, and the action that exposes the image of the measurement pattern IP at the multiple measurement points is repeated at the multiple Z-direction positions. Then, the image-formation characteristics of the projection-optical system 1 are calculated based on those exposed images. In such a scheme, it is not necessary to move the XY stage 5 between the action in which the Z-direction positions of the multiple measurement points on the wafer 3 are measured and the action in which the measurement pattern IP is exposed. The precision of the running guideway of the XY stage 5 is thus not relevant. Consequently, it is possible to determine the image-formation characteristics of the projection-optical system 1 with great accuracy.

Furthermore, since measurement of the Z-direction positions of the multiple measurement points on the wafer is performed by the focal-point detector 4 during exposure of the measurement-pattern image for the measurement points, the measurement time is dramatically reduced, and the resulting throughput (productivity) is dramatically improved.

The present invention is not limited to a stepper-type projection-exposure device. For example, a step-and-scan or other type of scanning projection-exposure device that synchronously scans the reticle and wafer, and then exposes and transfers the reticle pattern to each shot region on the wafer, can be used.

Figure 11:
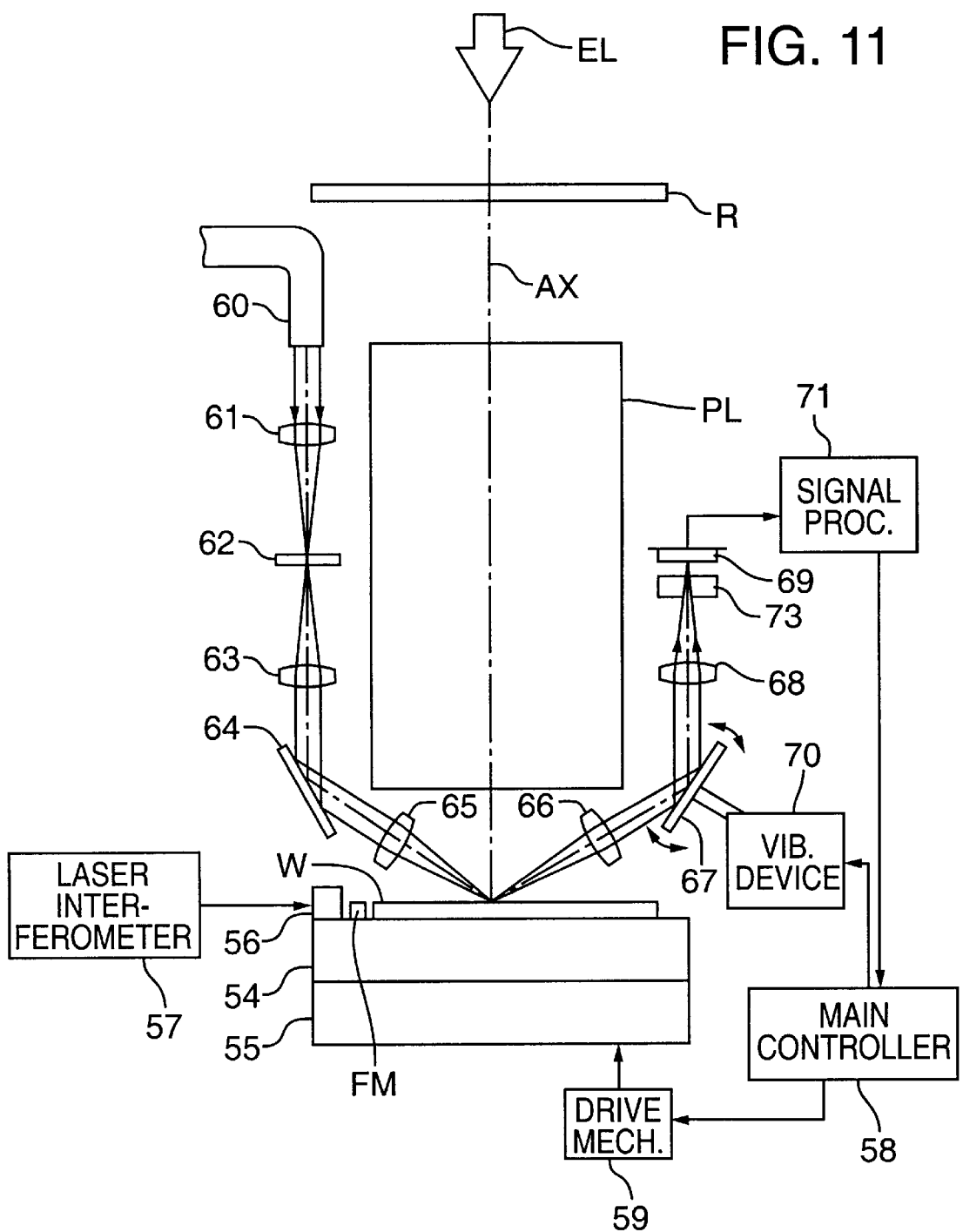
FIG. 11 is a schematic elevational drawing of a multi-point AF system according to a second embodiment of the present invention.

FIG. 11 shows certain principal components of a projection-exposure device according to a second embodiment of the present invention. An exposure light EL generated by illumination optics (not shown) serves to illuminate a pattern on the reticle R. The light passing through the reticle is projected by the projection-optical system PL for focusing onto each individual shot region of the wafer W that has been coated with a photoresist.

The wafer W is secured on the Z stage 54. The Z stage 54 is mounted on the XY stage 55. The reference plate FM is secured at substantially the same height position as the surface of the wafer W on the Z stage 54. The XY stage 55 is operable to position the wafer W inside the plane (XY plane) vertical to the optical axis AX of the projection-optical system PL. With respect to the optical axis AX, the Z stage 54 sets a Z-direction position and an inclination angle of the exposed surface of the wafer as required.

A movable mirror 56 is mounted on the Z stage 54. An external laser interferometer 57 monitors the X and Y coordinates of the XY stage 55 according to conventional technology. Data on the X and Y coordinates of the XY stage are routed from the interferometer 57 to a main controller 58. The main controller 58 controllably drives the XY stage 55 and the Z stage 54 by a conventional drive mechanism 59 in order to sequentially expose the reticle pattern onto each shot region on the wafer W using a step-and-repeat scheme. In order to establish a conjugate positional relationship between the reticle surface and the exposure surface of the wafer W with respect to the projection-optical system PL, a multi-point focal-point detection system (multi-point AF system) based on the oblique-incidence scheme is preferably used to control the position and inclination angle of the exposure surface of the wafer W relative to the optical axis AX. To such end, reference is made to U.S. Pat. No. 5,502,311, incorporated herein by reference.

In the oblique-incidence scheme employing a multi-point AF system, an illuminating light (distinct from the exposure light EL) producing a light wavelength to which the photoresist on the wafer W is insensitive is propagated from a source (not shown) through an optical fiber 60. The illuminating light passes through a first condensing lens 61 to illuminate a pattern-defining plate 62. The defined pattern comprises an array of slits. The illuminating light then passes through a second lens 63, reflects from a mirror 64, and passes through an objective lens 65 to project the pattern defined by the plate 62 onto the exposure surface of the wafer W. In this way, the slit image defined by the plate 62 is projected onto the exposure surface of the wafer w obliquely in relation to the optical axis AX. The angle of the optical axis of the objective lens 65 relative to the wafer surface is preferably 5 to 12 degrees. The slit image reflected by the wafer W is projected through a third condenser lens 66, a rotation-direction oscillating plate 67, an image-forming lens 68, and a plane-parallel plate 73 onto a light-receiving surface of a light detector 69. Thus, the image of the pattern on the plate 62 is also formed on the light-receiving surface of the light detector 69. The main controller 58 is operable to cause the rotation-direction oscillating plate 67 to vibrate, as described below, by means of a vibration device 70. Electrical signals generated by the multiple light-receiving elements in the light detector 69 are supplied to a signal processor 71. The signal processor 71 detects each electrical signal simultaneously with receiving drive signals from the vibration device, and also supplies the multiple focus signals to the main controller 58.

Figure 13A:
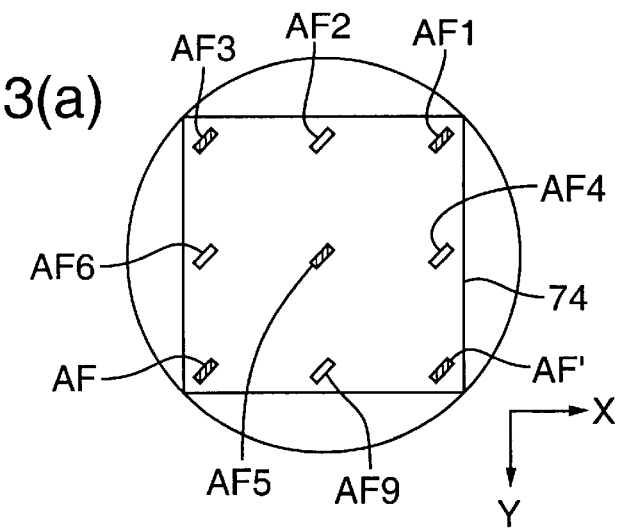
FIGS. 13(a), 13(b), and 13(c) are schematic plan views of a representative arrangement of measurement points, pattern-formation plate, and light receiver, respectively, in the multi-point AF system shown in FIG. 11.
Figure 13B:
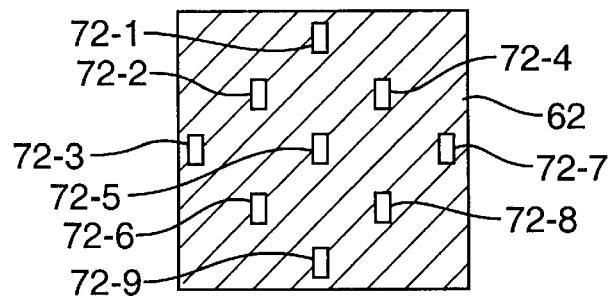

FIG. 13(b) shows a representative pattern of apertures defined by the pattern-forming plate 62. Nine diagonal slit-apertures 72-1 to 72-9 are defined. The slit-apertures 72-1 to 72-9 extend in a direction that intersects the exposure surface of the wafer W at 45 degrees relative to the X and Y axes. The projected images AF1–AF9 of the slit-apertures 72-1 to 72-9 are arranged, as shown in FIG. 13(a), to be within the exposure field 74 of the projection-optical system PL on the exposure surface of the wafer W. The projected image AF5 of the central slit-aperture 72-5 is located at a point where the optical axis AX of the projection-optical system PL intersects the wafer W. The positions where the projected images of the slit-apertures AF1–AF9 are projected on the wafer surface correspond to measurement points of the multi-point AF system.

Figure 13C:
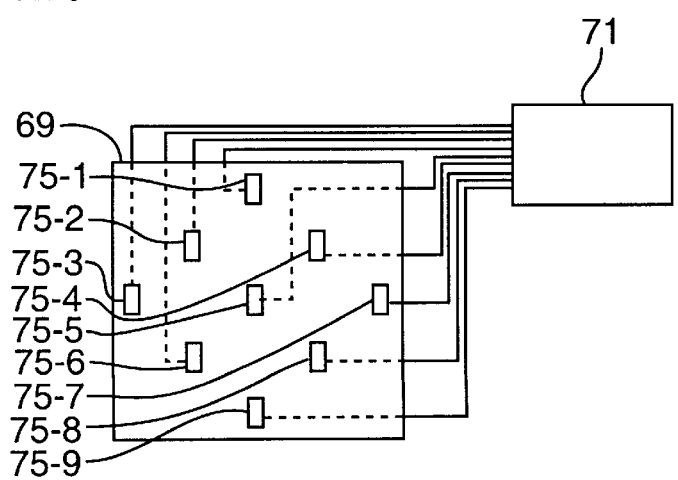

FIG. 13(c) shows the appearance of the light-receiving surface of the light receiver 69. Nine light-receiving elements 75-1 to 75-9 are arranged on the light-receiving surface. A visor shield (not shown) with a slit-shaped opening is placed on top of each light-receiving element 75-1 to 75-9.

An image of each measurement point AF1 to AF9 of FIG. 13(a) is re-formed at the respective light-receiving elements 75-1 to 75-9, respectively.

The slit pattern reflected by the exposure surface of the wafer W is reflected by the rotating vibration plate 67. Therefore, as FIG. 13(c) suggests, the positions at which the projected images of the slit-apertures AF1–AF9 are re-formed on each light-receiving element 75-1 to 75-9 vibrate in the RD direction (which is the width direction of the slit-apertures). The rotating vibration plate 67 is located at the pupil position of the third condenser lens 66; the plate 67 rotates and vibrates around a nearly vertical axis as suggested in FIG. 11. Since the images of the slit-apertures AF1–AF9 in FIG. 13(a) are projected diagonally with respect to the optical axis AX, the position of the respective re-formed images of the slit-apertures on the surface of the light receiver 69 changes to the RD direction whenever the focus positions on the exposure surface of the wafer W change.

The light-receiving elements 75-1 to 75-9 simultaneously produce respective focus signals corresponding to the direction positions (relative to the optical axis AX) of the surfaces to be measured at the measurement points AF1–AF9.

Figure 14:
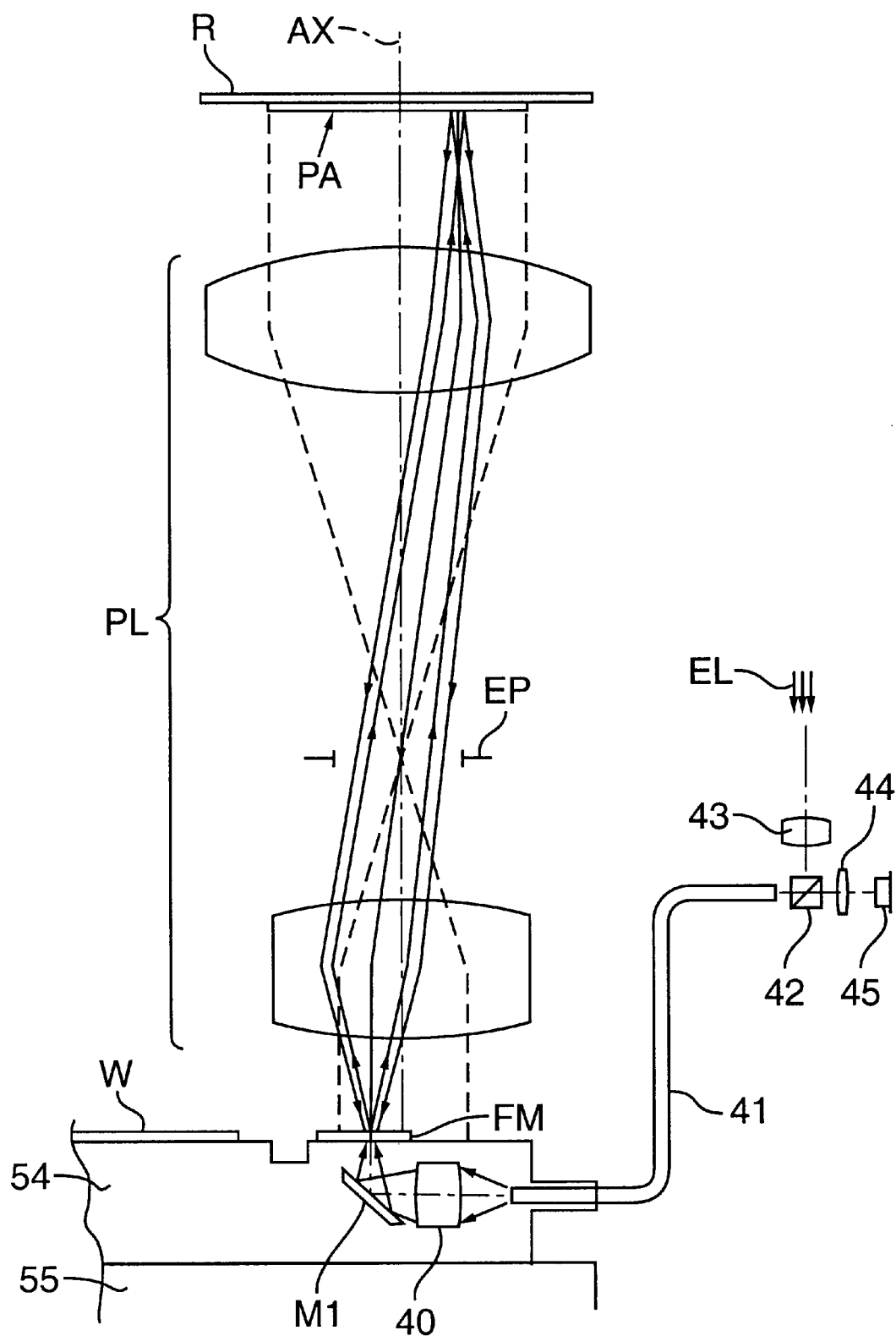
FIG. 14 is an elevational drawing providing explanatory information concerning a TTL-type focal-point detection system according to the invention.
Figure 15:
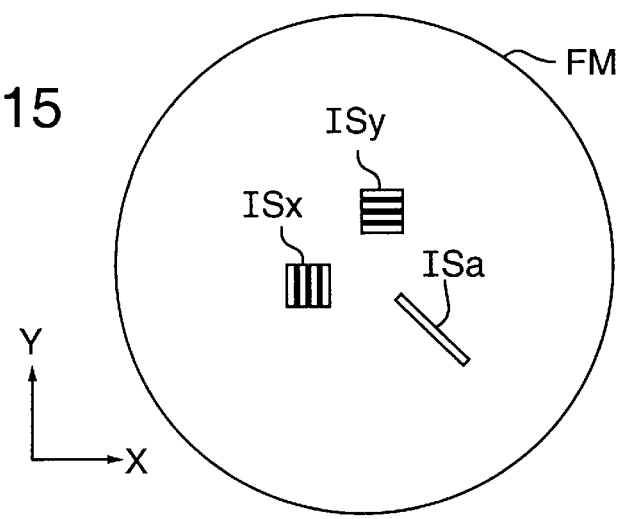
FIG. 15 is a plan view of a representative pattern arrangement of marks on the reference plate FM in FIG. 14.
Figure 16:
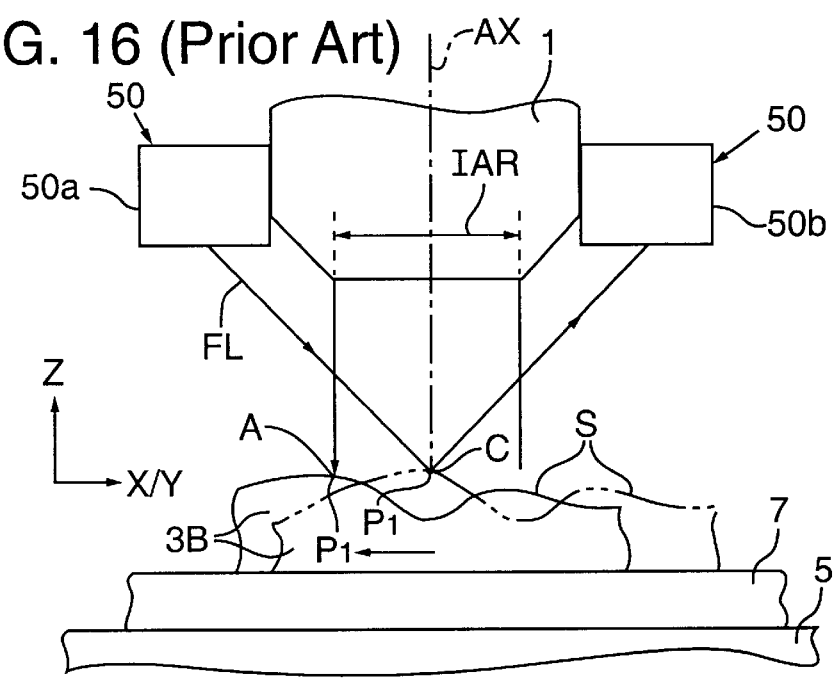
FIG. 16 is an elevational drawing providing explanatory information concerning how the position of the image-formation surface is measured in a prior-art projection-exposure system.
Figure 17:
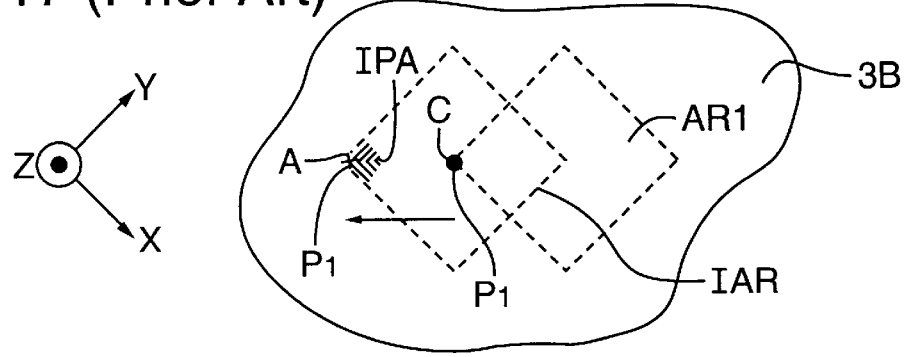
FIG. 17 is a plan view showing the measurement points in FIG. 16.

Another projection-exposure apparatus according to the invention comprises a TTL-type focal-point detection system that operates using a projection-optical system PL, as shown in FIG. 14. Such a TTL type focal-point detection system employs a reference plate FM, described previously, to detect the best-focus position of the projection-optical system PL. As FIG. 15 illustrates, the reference plate FM defines a mark ISy comprising multiple slit-apertures each extending in the X direction and arranged at a uniform pitch in the Y direction. The reference plate FM also defines a mark ISx comprising multiple slit-apertures extending in the Y direction and arranged at a uniform pitch in the X direction, and a diagonal slit ISa oriented 45 degrees to both the X and Y directions. The marks ISx, ISy, and ISa are preferably transparent areas on a metal film (e.g., chromium) that otherwise blocks light.

As FIG. 14 illustrates, a mirror M1, an objective lens 40, and an optical fiber 41 are provided beneath the reference plate FM (preferably inside the Z stage 54). An illuminating beam exiting the distal end of the optical fiber 41 is focused by the objective lens 40 onto the reference plate FM. Thus, the slit marks ISx, ISy, and ISa are irradiated from the rear of the reference plate FM. The illuminating beam EL is introduced to the optical fiber 41 through a beam splitter 42. Of the light passing through the projection-optical system PL, light penetrating the slit marks ISx, ISy, and ISa is directed back through the optical fiber 41 and received by a photoelectric sensor 45 after passing through the beam splitter 42 and a suitable lens group 44.

Figure 12:
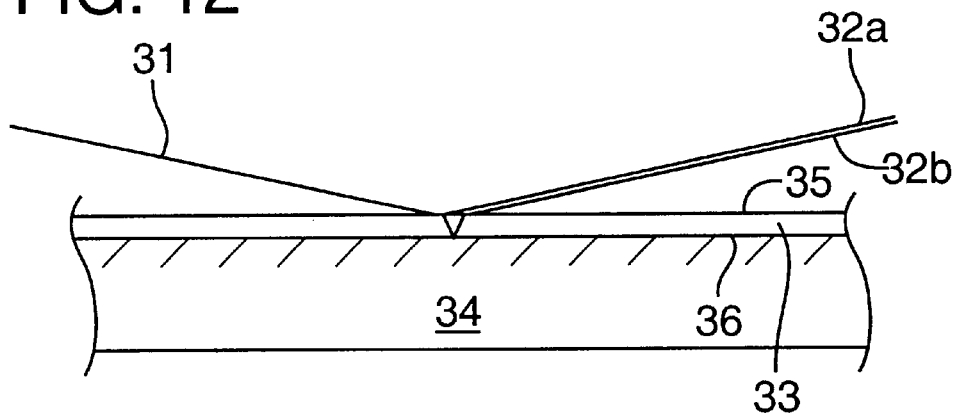
FIG. 12 is a elevational drawing providing explanatory information concerning reflection of light beam from the wafer surface.

Whenever the reticle R is replaced and projection exposure begins with a new reticle pattern (i.e., when a new process wafer is placed on the wafer stage, in other words, when a first wafer of a new process lot is placed on the wafer stage), any focus offset is preferably re-measured by the multi-point AF system before exposure. The reason for such re-measurement is as follows:

Offset can arise from tolerances in manufacturing the light-transmitting slits in the reference plate. Offsets can also arise from changes occurring with or in the light-receiving elements of the multi-point AF system. Other causes are optical aberrations as well as tilting, bumps, or dents in the running guideway of the wafer stage. Another cause can be a change in the type of wafer that the multi-point AF sensor is detecting. For example, FIG. 12 shows a Z-position-detecting light beam 31 obliquely impinging on a surface coated with a layer 33 (e.g., photoresist) that is either transparent or semi-transparent. The beam 31 is incident at multiple measurement points on the surface. A beam 32a produced by reflection from the resist surface 35 and a beam 32b produced by reflection from the wafer surface 36 overlap each other and enter a light sensor (not shown). In such an instance, there would be different relative amounts of light reflected from the wafer surface versus the resist surface due to differences in the resist 33 applied to the wafer 34. Offset also can arise from changes in the interference of the beams 32a, 32b.

By way of example, in order to determine any offset between the light-receiving elements in a multi-point AF system as shown in FIG. 13(c), a first step is to perform a calibration of the output of the light-receiving element 75-5 using the TTL type focal-point detection system shown in FIG. 14. To perform such a calibration, the XY stage 55 is actuated, and the centers of the slit marks ISx, ISy, and ISa on the reference plate are positioned on the optical axis AX. Such positioning does not need to be strictly precise. The centers of the slit marks relative to the mark AF may be, for example, 100 μm in the X and/or Y directions. After the XY stage 55 is positioned, the Z stage 54 is moved vertically (Z direction) at a constant velocity while the TTL-type focal-point detection system shown in FIG. 14 and the multi-point AF system shown in FIG. 11 are simultaneously operated.

In a TTL-type focal-point detection system, an imaging light beam propagates from the slit marks ISx, ISy, and ISa on the reference plate FM to the projection-optical system PL. The images of the slit marks are reversed upon passage through the projection-optical system PL and are condensed near the pattern surface PA of the reticle R. The images are reflected from the pattern surface PA and return along their original optical path. Image formation occurs at or near the surface of the reference plate FM. When the Z stage 54 is placed so as to position the reference plate FM at the optimum image-formation surface (i.e., the reticle conjugate surface), images in the shapes of the marks ISx, ISy, and ISa are formed on the reference plate FM, superimposed on the respective marks defined by the reference plate.

Whenever the reference plate FM is at a defocused elevation, the reflected image of each slit mark formed at the actual marks ISx, ISy, and ISa is larger than the actual marks on the reference plate FM, and light intensity per unit area of the respective marks decreases. Light passing through the slit marks ISx, ISy, and ISa are received by the optical fiber 41 via the mirror Ml and the objective lens 40. After passing through the optical fiber 41, the light enters the photoelectric sensor 45. Whenever the Z stage 54 is being moved vertically (Z direction), such light is being received by the photoelectric sensor 45. The Z-stage position at which the maximum amount of light is received by the photoelectric sensor 45 is regarded as the best-focus position.

While the Z stage 54 is moving in the Z direction, the multi-point AF system monitors focus signals pertaining to measurement point AF5 (FIG. 13(a)). The focus signals are generated from electrical signals produced by the light-receiving element 75-5 and processed by the signal processor 71, along with vibration signals produced by the rotating vibration plate 67. When the TTL-type focal-point detection system detects that the Z stage has reached the best-focus position for the point AF5, the rotation angle of the parallel plane 73 is adjusted so that the focus signal corresponding to the measurement point AF5 also indicates the best focus. The light-receiving element 75-5 of the multi-point AF system is now calibrated.

Calibration of the light-receiving element 75-5 can also be performed, for example, electrically using a method by which a bias signal is added to the output signal of the light-receiving element 75-5 instead of rotating the parallel plane 73.

Next, the offset of the other light-receiving elements 75-1 to 75-4 and 75-6 to 75-9 are measured with respect to the light-receiving element 75-5 serving as a reference for the multi-point AF system.

The offset measurement is performed in the following way, using the wafer that is to be exposed. First, the XY stage 55 is actuated. A random point P on the wafer W is positioned on the optical axis AX. The Z stage 54 is moved until the signal from the light-receiving element 75-5 indicates that a best-focus position has been reached for the measurement point AF5. The wafer W is now focused at the measurement point AF5.

Next, the point P on the wafer 5 moves to the measurement point AF1. This can be executed easily by running the XY stage 55 on the basis of the known positional relationship between the measurement point AF5 and the measurement point AF1. After moving the wafer, measurement of the Z position (position along the optical axis AX) of the measurement point AF1 is performed using the light-receiving element 75-1. The measured value represents an offset relative to the value indicated by the light-receiving element 75-5 as being a best-focus position.

In the same way, the point P on the wafer W is moved sequentially to the measurement points AF2–AF4 and AF6–AF9 by actuating the XY stage 55. Offset measurement of the remaining light-receiving elements 75-2 to 75-4 and 75-6 to 75-9 is performed.

Afterward, when the reticle pattern is exposed onto the wafer W, focusing is performed using the multi-point AF system, considering the offsets of the light-receiving elements 75-1 to 75-4 and 75-6 to 75-9 for the measurement points AF1–AF4 and AF6–AF9, respectively, with respect to the light-receiving element 75-5 associated with the measurement point AF5.

In short, the nine diagonal slit patterns 72-1 to 72-9 on the pattern-forming plate 62 are projected onto the exposure surface of the wafer W using illuminating light from the optical fiber 60 of the multi-point AF system. The individual focus positions of the nine measurement points AF1–AF9 are detected by the nine respective light-receiving elements 75-1 to 75-9.

The signal from the light-receiving element 75-5 is used unchanged as a reference without any alteration in this instance. Any variation in measurement signals attributed to the condition of the multi-point AF system or to the wafer W surface is compensated for either by applying an offset to the signals from the light-receiving elements 75-1 to 75-4 and 75-6 to 75-9, or by adding bias signals to the detection signals of the light-receiving elements 75-1 to 75-4 and 75-6 to 75-9 so that the individual difference of each signal relative to the signal produced by the element 75-5 is zero. It is thereby possible to measure the focus position of each measurement point AF1–AF9.

From the focus positions of the nine measurement points AF1–AF9 inside the exposure field 74, the signal processor 71 determines the inclination angle of an "average surface" of the exposure field 74 and the focus position (Z position) of the average surface using a calculation method such as least squares. Data concerning the results of such calculations are supplied to the main controller 58. The main controller 58 sets the focus point and inclination angle (leveling angle) of the shot region of the wafer W to a specific value by means of the driver 59 and the Z stage 54. In this way, the pattern image on the reticle R is exposed on each shot region of the wafer W with the optimal focus position (Z position) and inclination angle aligned on the image surface of the projection-optical system PL.

Measurement of any offset between the multiple measurement points can be done using a procedure such as the following. At the beginning, calibration is performed using the output of the light-receiving element 75-5 associated with a measurement point that is the reference of the multi-point AF system. An example is the measurement point AF5 on the optical axis AX of the projection-optical system PL. The calibration is done using the method as described above, using a TTL-type focal-point detection system as shown in FIG. 14.

Next, the XY stage 55 is actuated to position the wafer W that is to be exposed. A random point P on the wafer W is positioned at the optical axis AX of the projection-optical system PL. The nine diagonal slit patterns on the pattern-forming plate 62 (i.e., the patterns 72-1 to 72-9) are projected onto the exposure surface of.the wafer W by an illumination beam from the optical fiber 60 of the multi-point AF system shown in FIG. 11. The Z stage 54 now moves so that a signal from the light-receiving element 75-5 associated with the measurement point AF5 indicates the best focus.

The measurement point AF5 is now focused on the wafer W. The detection outputs of the light-receiving elements 75-1 to 75-4 and 75-6 to 75-9 provide indications of the Z positions of the other measurement points AF1 to AF-4 and AF-6 to AF-9, respectively. Those measurements are denoted SA-1 to SA-4 and SA-6 to SA-9, respectively. The measurement points AF1, AF2, . . . AF9 of the multi-point AF system now are considered to correspond to points P1, P2, . . . P9 on the wafer.

Next, the XY stage 55 is actuated and the point Pi on the wafer W (which is equivalent to the measurement point AF1) moves to the optical axis AX. When the Z position of the point P1 at the measurement point AF5 is measured, the measured value is denoted SB1. In the same way, points P2, P3, P4, P6, . . . P9 on the wafer W move sequentially to the optical axis AX, and the respective values of measurements of the respective Z positions (relative to that of the measurement point AF5) are denoted SB2, SB3, SB4, SB6, SB9. From these measurements, offsets for each of the measurement points AF1, AF2, . . . AF4, AF6, AF9 (relative to the result obtained for the measurement point AF5) are determined by subtracting (SA1–SB1), (SA2–SB2), . . . (SA4–SB4), . . . , and (SA9–SB9), respectively.

When the pattern of the reticle R is exposed onto the wafer W, the offset of each light-receiving element 75-1 to 75-4 and 75-6 to 75-9 that has been measured as described above is taken into consideration when focusing using the multi-point AF system, in the same way as described above.

The present invention can also be utilized in scanning-type projection-exposure devices as described in, for example, U.S. Pat. No. 5,448,332 (corresponding to Japanese laid-open patent document Hei 6-283403).

Whereas the invention has been described in connection with a preferred and several alternative embodiments, it will be understood that the invention is not limited to those embodiments. On the contrary, the invention is intended to encompass all alternatives, modifications, and alternatives as may be included within the spirit and scope of the invention as defined by the appended claims.

What is claimed is:

1. A projection-exposure method, comprising the steps:
   (a) placing a plurality of points, located on a substrate, within an exposure field of a projection-optical system;
   (b) detecting a position of each of the points on the substrate in an axial direction of the projection-optical system;
   (c) exposing each of the points on the substrate with an image of a measurement pattern through the projection-optical system so as to form an image of the pattern on the substrate;
   (d) obtaining an image-formation characteristic of the projection-optical system based on information pertaining to the pattern formed at the points on the substrate and on the detected positions, when the pattern is exposed, corresponding to the points on the substrate; and
   (e) based on the obtained image-formation characteristic, exposing a substrate with an image of a pattern formed on a mask.

2. The method of claim 1, wherein, in step (c), a detection beam, of a detection system that detects a position of the substrate in the axial direction of the projection-optical system, is directed at the substrate within the exposure field at an angle to an optical axis of the projection-optical system.

3. A method for measuring an image-formation characteristic of a projection-optical system, comprising the steps:
   (a) arranging a substrate on an image-plane side of the projection-optical system;
   (b) detecting a position of each of a plurality of measurement points on the substrate in an axial direction of the projection-optical system;
   (c) exposing each of the measurement points, situated on the substrate within an exposure field of the projection-optical system, with an image of a measurement pattern through the projection-optical system; and
   (d) obtaining an image-formation characteristic of the projection-optical system based on information concerning the pattern formed at the measurement points on the substrate and on the detected positions, when the pattern is exposed, corresponding to the measurement points on the substrate.

4. The method of claim 3, wherein each of a number and an arrangement of the points on the substrate in the axial direction of the projection-optical system is selected to correspond with a desired measurement precision of the projection-optical system.

5. The method of claim 3, wherein the image-formation characteristic is an image-surface curvature.

6. The method of claim 3, wherein step (c) is performed using a detection system comprising a sensor element for detecting light reflected from the measurement points on the substrate.

7. The method of claim 6, further comprising the step, before step (a), of calibrating the sensor element.

8. The method of claim 7, wherein calibration of the sensor element is performed by a method in which a bias signal is added as required to an output signal of the sensor element.

9. A projection-exposure method, comprising the steps:
   (a) placing a plurality of points, located on a substrate, within an exposure field of a projection-optical system;
   (b) detecting a position of each of the points on the substrate in an axial direction of the projection-optical system and producing an electrical signal corresponding to each respective detected position;
   (c) exposing each of the points on the substrate with an image of a measurement pattern through the projection-optical system so as to form an image of the pattern on the substrate;
   (d) obtaining an image-formation characteristic of the projection-optical system based on information pertaining to the pattern formed at the points on the substrate and on the detected positions, when the pattern is exposed, corresponding to the points on the substrate; and
   (e) adjusting the signals produced by the detection system based on the desired image-formation characteristic.

10. A projection-exposure method, comprising the steps:
    (a) placing a plurality of points, located on a substrate, within an exposure field of a projection-optical system;
    (b) detecting a position of each of the points on the substrate in an axial direction of the projection-optical system;
    (c) exposing each of the points on the substrate with an image of a measurement pattern through the projection-optical system so as to form an image of the pattern on the substrate;
    (d) obtaining an image-formation characteristic of the projection-optical system based on information pertaining to the images formed at the points on the substrate and on the detected positions, when a pattern is exposed, corresponding to the pattern formed on the substrate; and
    (e) based on the obtained image-formation characteristic, controlling an inclination angle of a lens of the projection-optical system.

* * * * *

UNITED STATES PATENT AND TRADEMARK OFFICE
CERTIFICATE OF CORRECTION

PATENT NO.  : 5,985,495

DATED       : November 16, 1999

INVENTOR(S) : Okumura et al.

It is certified that errors appear in the above-identified patent and that said Letters Patent is hereby corrected as shown below:

Column 8, line 4, "a elevational" should be --an elevational--.

Column 8, line 34, "AX of is a" should be --AX of a--.

Column 10, line 20, "like.)." should be --like).--.

Column 10, line 55, --a-- should be inserted after "to" and before "'Z-direction'".

Column 12, line 15, "point AE" should be --point A-E--.

Column 13, line 28, "marks-are" should be --marks are--.

Column 14, line 32, "including the Z" should be --including the $Z_{A1}$--.

Column 15, line 35, "$LY_E$" should be --$\Delta LY_E$--.

Column 16, line 52, "wafer w" should be --wafer W--.

Column 17, line 50, "TTL type" should be --TTL-type--.

Column 18, line 4, "the." should be --the--.

UNITED STATES PATENT AND TRADEMARK OFFICE
CERTIFICATE OF CORRECTION

PATENT NO. : 5,985,495

DATED : November 16, 1999

INVENTOR(S) : Okumura et al.

It is certified that error appears in the above-identified patent and that said Letters Patent is hereby corrected as shown below:

Column 18, line 40, "TTL type" should be --TTL-type--.

Column 20, line 51, "AF-4" should be --AF4--.

Column 20, line 52, "AF-6" should be --AF6--, and "AF-9" should be --AF9--.

Column 20, line 53, "SA-1" should be --SA1--, "SA-4" should be --SA4--, "SA-6" should be --SA6--, and "SA-9" should be --SA9--.

Column 20, line 57, "point Pi" should be --point P1--.

Column 20, line 65, "SB6, SB9" should be --SB6, . . . SB9--.

Column 20, line 67, "AF6, AF9" should be --AF6, . . . AF9--.

Signed and Sealed this

Seventeenth Day of April, 2001

Attest:

NICHOLAS P. GODICI

*Attesting Officer*   *Acting Director of the United States Patent and Trademark Office*